(12) United States Patent
Yu

(10) Patent No.: US 6,784,711 B2
(45) Date of Patent: Aug. 31, 2004

(54) SEQUENTIAL PULSE TRAIN GENERATOR

(75) Inventor: Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/600,785

(22) Filed: Jun. 19, 2003

(65) Prior Publication Data

US 2004/0008193 A1 Jan. 15, 2004

(30) Foreign Application Priority Data

Jul. 9, 2002 (TW) .......................... 91115158 A

(51) Int. Cl.⁷ .............................................. H03K 7/02
(52) U.S. Cl. ...................................... 327/178; 327/296
(58) Field of Search ................................ 327/178, 181, 327/291, 295–296, 298

(56) References Cited

U.S. PATENT DOCUMENTS

| 5,644,329 A | * | 7/1997 | Asari et al. ................... 345/89 |
| 5,923,320 A | * | 7/1999 | Murakami et al. ........... 345/179 |
| 6,236,385 B1 | * | 5/2001 | Nomura et al. ................ 345/95 |
| 6,580,411 B1 | | 6/2003 | Kubota et al. ................. 345/98 |

FOREIGN PATENT DOCUMENTS

JP    2000-339985    12/2000

* cited by examiner

Primary Examiner—Timothy P. Callahan
Assistant Examiner—Cassandra Cox
(74) Attorney, Agent, or Firm—Ladas & Parry

(57) ABSTRACT

A sequential pulse train generator. Each stage of the sequential pulse train generator includes a dynamic shift register circuit, level shifter, and buffer composed of inverters. The dynamic shift register circuits, allow the pulse generator to operate with a low-voltage clock signal so that power consumption in transmission of the clock signal is reduced.

15 Claims, 10 Drawing Sheets

SEQUENTIAL PULSE TRAIN GENERATOR

BACKGROUND OF THE INVENTION

1. Field of the Invention

The present invention relates to a sequential pulse train generator and particularly to a sequential pulse train generator for liquid crystal displays (LCDs), which operates with a low-voltage clock signal supply.

2. Description of the Prior Art

In LCDs, a frame of image is formed by lines of pixels sequentially scanned by a gate driver. The gate driver must generate a sequential pulse train to drive the scan lines. Thus, a sequential pulse train generator is an essential element of an LCD.

FIG. 1 is a diagram showing a conventional sequential pulse train generator for the LCD. For the sake of clarity, only three stages are exemplified in FIG. 1 although the sequential pulse train generator may be composed of more stages. Each of the stages includes a shift register 111, 112 or 113, and a level shifter 121, 122 or 123. The shift register 111, 112 or 113 receives a clock signal CK and an inverted clock signal CK'. The shift register 111 in the first stage further receives an initial pulse train IN. The initial pulse train IN is sequentially delayed through the stages and its level is shifted by the level shifter 121, 122 and 123 so that a sequential pulse train having a sufficient pulse level is generated.

The resistances 131 and 132, and capacitances 151 and 152 of the transmission lines for the clock signal CK and CK' cannot be zero. There are also resistances 141, 142 and 143, and capacitances 161, 162 and 163 on the output lines for the pulse train. These resistances and capacitances induce some power consumption in the LCD.

However, the power consumption of a transmission line is proportional to the amplitude of the signal there on. The conventional sequential pulse train generator needs a relatively high voltage clock supply, which induces high power consumption.

SUMMARY OF THE INVENTION

The object of the present invention is to provide a sequential pulse train generator operating with a low-voltage clock signal supply to reduce power consumption in transmission of the clock signal.

The present invention provides a sequential pulse train generator comprising a first and second dynamic shift register circuit, each of which has a first, second, third and fourth input terminal, and a first, second and third output terminal, first, second, third and fourth input terminal of the first dynamic shift register circuit coupled to receive an initial pulse train, the inverted initial pulse train, a clock signal and the inverted clock signal, the first output terminal of the first dynamic shift register circuit coupled to the first input terminal of the second dynamic shift register circuit, the third and fourth input terminal of the second dynamic shift register circuit coupled to receive the inverted clock signal and the clock signal, respectively, a first and second level shifter, each of which has a first and second input terminal, and an output terminal, the first and second input terminal of the first level shifter coupled to the second and third output terminal of the first dynamic shift register circuit, the output terminal of the first level shifter coupled to the first output terminal of the first dynamic shift register circuit, the first and second input terminal of the second level shifter coupled to the second and third output terminal of the second dynamic shift register circuit, the output terminal of the second level shifter coupled to the first output terminal of the second dynamic shift register circuit, respectively, and a first and second inverter having output terminals coupled to the output terminals of the first and second level shifter, and outputting a first and second sequential pulse train, the output terminal of the first inverter coupled to the second input terminal of the second dynamic shift register circuit.

The present invention further provides a sequential pulse train generator comprising a first, second and third dynamic shift register circuit, each of which has a first, second and third input terminal, and a first, second and third output terminal, the first, second and third input terminal of the first dynamic shift register coupled to receive an initial pulse train, the inverted initial pulse train and a clock signal, the first output terminal of the first dynamic shift register circuit coupled to the second input terminal of the third dynamic shift register circuit, the third input terminal of the second dynamic shift register coupled to receive the inverted clock signal, the third input terminal of the third dynamic shift register circuit coupled to receive the clock signal, a first, second and third level shifter, each of which has a first and second input terminal, and an output terminal, the first and second input terminal of the first level shifter coupled to the second and third output terminal of the first dynamic shift register circuit, the first and second input terminal of the second level shifter coupled to the second and third output terminal of the second dynamic shift register circuit, the first and second input terminal of the third level shifter coupled to the second and third output terminal of the third dynamic shift register circuit, and a second, third, fourth, fifth, sixth and seventh inverter, input terminals of the second, third and fourth inverter coupled to the output terminals of the first, second and third level shifter, output terminals of the second and third inverter coupled to the first input terminals of the second and third dynamic shift register circuit, input terminals of the fifth, sixth and seventh inverter coupled to the output terminals of the second, third and fourth inverter, an output terminal of the fifth inverter coupled to the second input terminal of the second dynamic shift register circuit, the output terminals of the fifth, sixth and seventh inverter outputting a first, second and third sequential pulse train, respectively.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
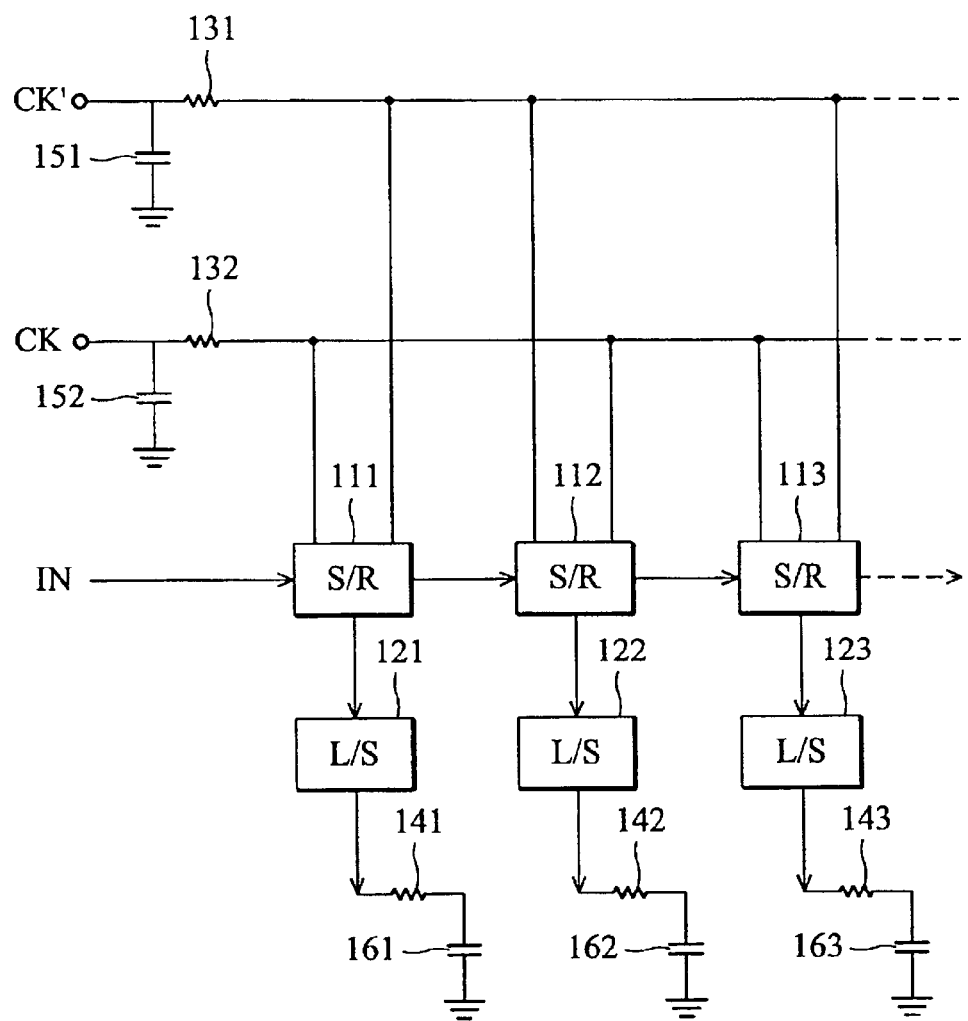
FIG. 1 is a diagram showing a conventional sequential pulse train generator.
Figure 2A:
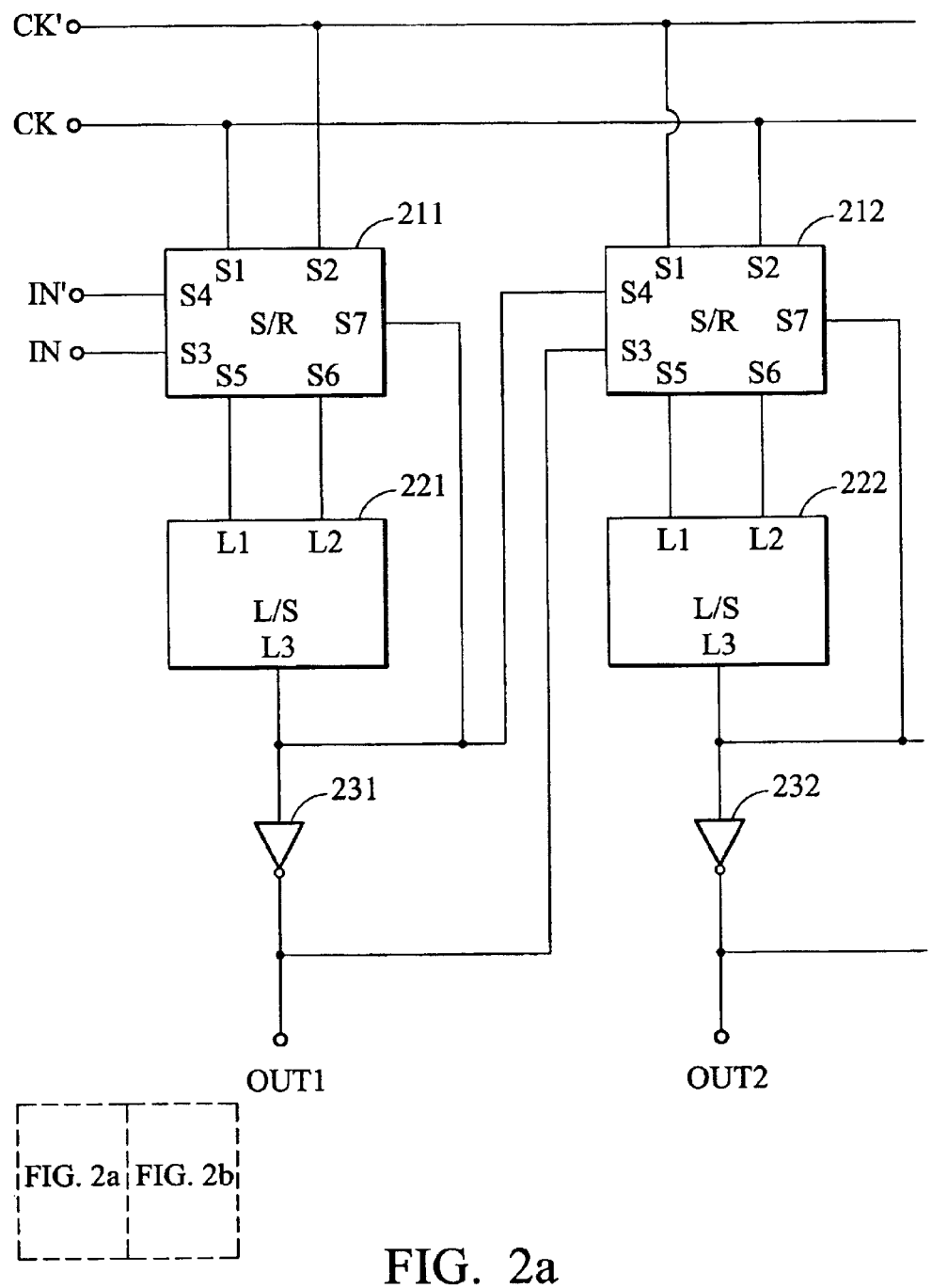
FIGS. 2a and 2b are diagrams showing a sequential pulse train generator according to a first embodiment of the invention.
Figure 2B:
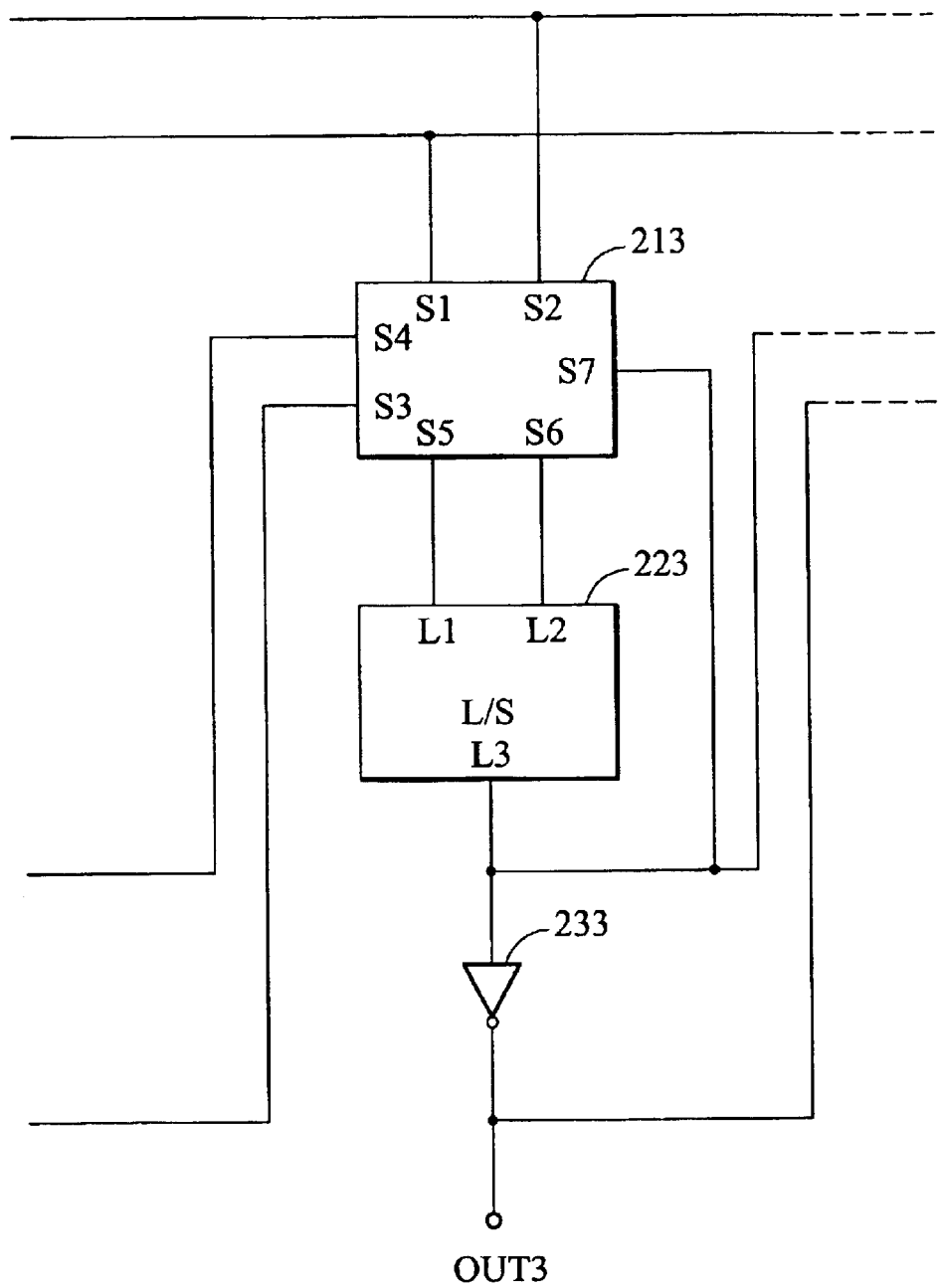

FIGS. 2a and 2b are diagrams showing a sequential pulse train generator according to a first embodiment of the invention. For sake of clarity, only three stages are exemplified. The sequential pulse train generator includes dynamic shift register circuits 211, 212 and 213, level shifters 221, 222 and 223, and inverters 231, 232 and 233 used as buffers. Each of the dynamic shift register circuits has input terminals S1, S2, S3, S4 and S7, and output terminals S5 and S6. The input terminals S3, S4, S1 and S2 of the dynamic shift register circuit 211 are respectively coupled to receive an initial pulse train IN, the inverted initial pulse train IN', a clock signal CK and the inverted clock signal CK'. The input terminal S7 of the dynamic shift register circuit 211 is coupled to the input terminal S4 of the dynamic shift register circuit 212. The input terminal S7 of the dynamic shift register circuit 212 is coupled to the input terminal S3 of the dynamic shift register circuit 213. The input terminals S1 and S2 of the dynamic shift register circuit 212 are respectively coupled to receive the inverted clock signal CK' and the clock signal CK. The input terminals S1 and S2 of the dynamic shift register circuit 213 are respectively coupled to receive the clock signal CK and the inverted clock signal CK'.

Each of the level shifters has input terminals L1 and L2, and an output terminal L3. The input terminals L1 and L2 of the level shifter 221 are coupled to the output terminals S5 and S6 of the dynamic shift register circuit 211. The input terminals L1 and L2 of the level shifter 222 are coupled to the output terminals S5 and S6 of the dynamic shift register circuit 212. The input terminals L1 and L2 of the level shifter 223 are coupled to the output terminals S5 and S6 of the dynamic shift register circuit 213. The output terminal L3 of the level shifter 221 is coupled to the input terminal S7 of the dynamic shift register circuit 211. The output terminal L3 of the level shifter 222 is coupled to the input terminal S7 of the dynamic shift register circuit 212. The output terminal L3 of the level shifter 223 is coupled to the input terminal S7 of the dynamic shift register circuit 213.

The inverters 231, 232 and 233 have input terminals coupled to the output terminals L3 of the level shifters 221, 222 and 223, and outputting sequential pulse trains OUT1, OUT2 and OUT3, respectively. The output terminal of the inverter 231 is coupled to the input terminal S3 of the dynamic shift register circuit 212. The output terminal of the inverter 232 is coupled to the input terminal S4 of the dynamic shift register circuit 213.

Figure 3:
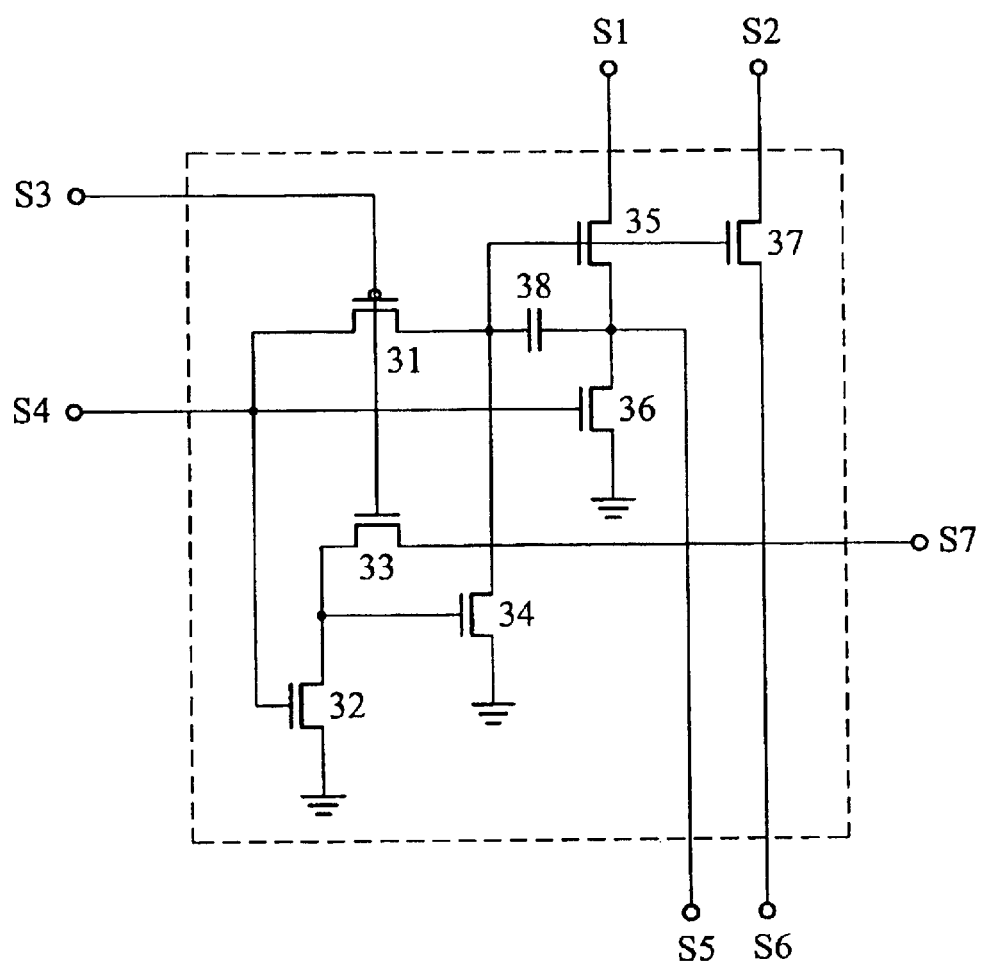
FIG. 3 is a diagram showing a dynamic shift register circuit according to the first embodiment of the invention.

FIG. 3 is a diagram showing the dynamic shift register circuit according to the first embodiment of the invention. It includes a P-type transistor 31, N-type transistors 32~37 and a capacitor 38. The transistor 31 has a gate coupled to the input terminal S3 and a drain coupled to the input terminal S4. The transistor 32 having a gate coupled to the input terminal S4 and a source coupled to receive a ground voltage. The transistor 33 has a gate coupled to the input terminal S3, a drain coupled to the input terminal S7 and a source coupled to a drain of the transistor 32. The transistor 34 has a gate coupled to the source of the transistor 33, a drain coupled to a source of the transistor 31 and a source coupled to receive the ground voltage. The transistor 35 has a gate coupled to the source of the transistor 31, a drain coupled to the input terminal S1 and a source coupled to output terminal S5. The transistor 36 has a gate coupled to the input terminal S4, a drain coupled to the source of the transistor 35 and a source coupled to receive the ground voltage. The transistor 37 has a gate coupled to the gate of the transistor 35, a drain coupled to the input terminal S2 and a source coupled to the output terminal S6.

The capacitor 38 is coupled between the gate and source of the transistor 35, which may be the gate-to-source parasitic capacitance of the transistor 35.

Figure 4:
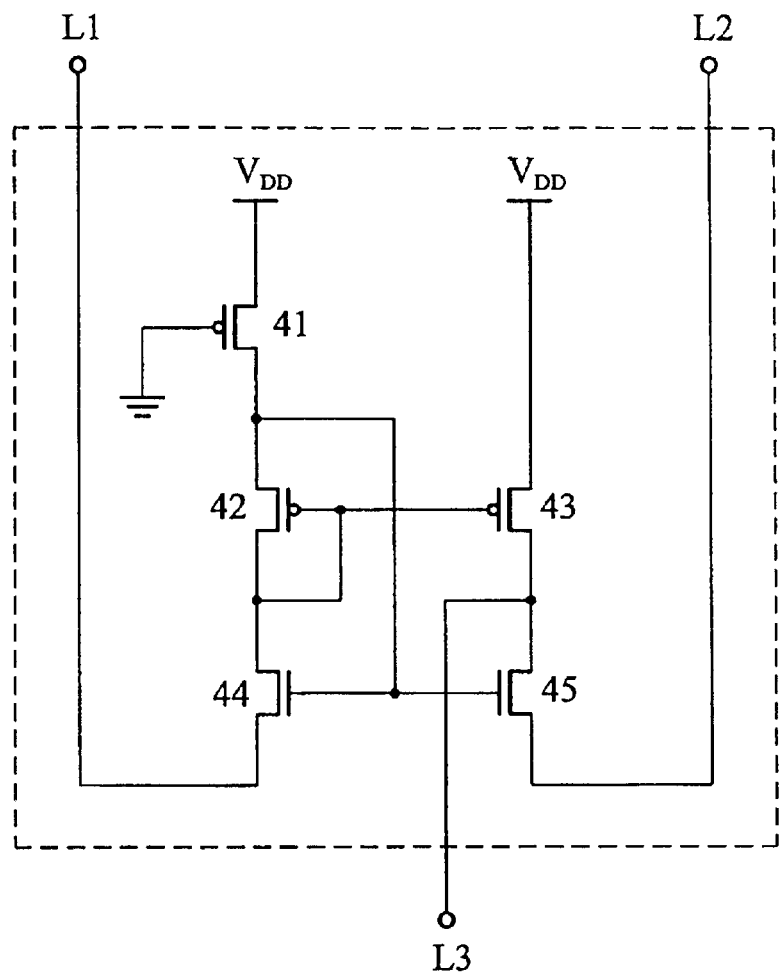
FIG. 4 is a diagram showing a level shifter according to the first embodiment of the invention.

FIG. 4 is a diagram showing a level shifter according to the first embodiment of the invention. It includes P-type transistors 41~43, and N-type transistors 44 and 45. The transistor 41 has a gate coupled to receive the ground voltage and a source coupled to receive voltage VDD. The transistor 42 has a coupled gate and drain, and a source coupled to a drain of the transistor 41. The transistor 43 has a gate coupled to the gate of the transistor 42, a source coupled to receive the voltage VDD and a drain coupled to the output terminal L3. The transistor 44 has a gate coupled to the drain of the transistor 41, a source coupled to the drain of the transistor 42 and a drain coupled to the input terminal L1. The transistor 45 has a gate coupled to the gate of the transistor 44, a source coupled to the drain of the transistor 43 and a source coupled to the input terminal L2.

Figure 5A:
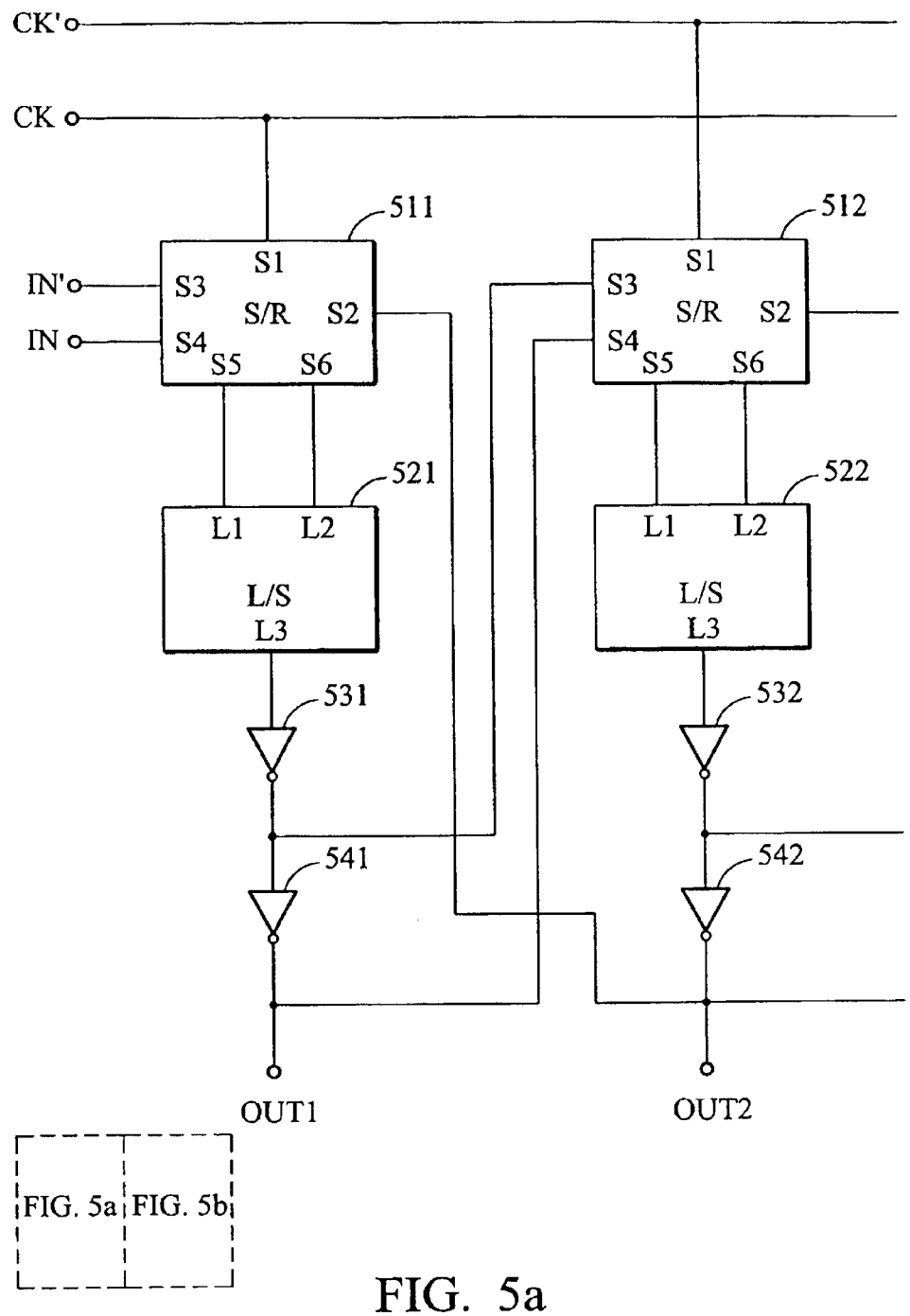
FIGS. 5a and 5b are diagrams showing a sequential pulse train generator according to a second embodiment of the invention.
Figure 5B:
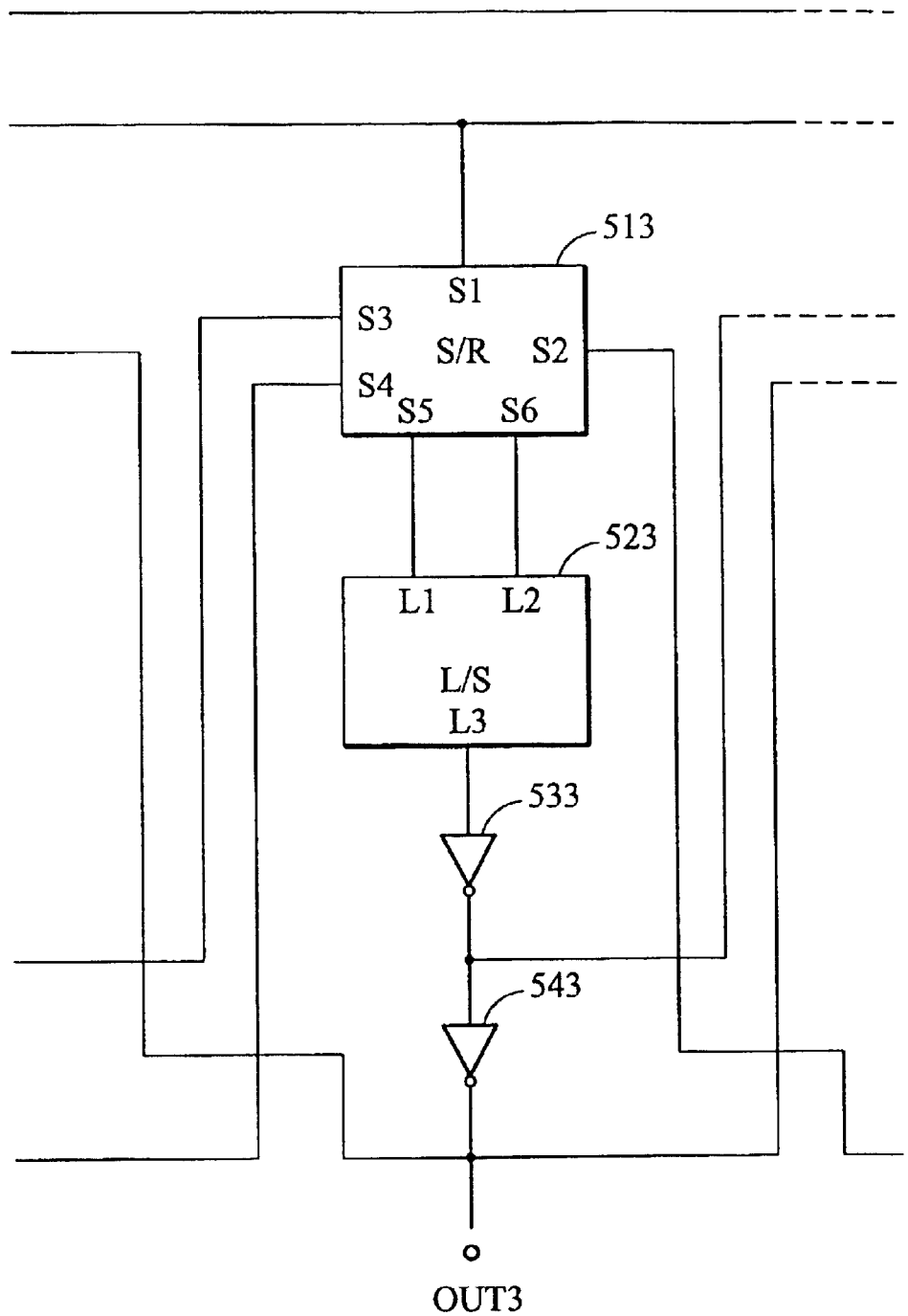

FIGS. 5a and 5b are diagrams showing a sequential pulse train generator according to a second embodiment of the invention. For the sake of clarity, only three stages are exemplified. The sequential pulse train generator includes dynamic shift register circuits 511, 512 and 513, level shifters 521, 522 and 523, and inverters 531, 532 and 533 used as buffers. Each of the dynamic shift register circuits has input terminals S1, S2, S3 and S4, and output terminals S5 and S6. The input terminals S3, S4 and S1 of the dynamic shift register circuit 511 are coupled to receive an initial pulse train IN, the inverted initial pulse train IN' and a clock signal CK. The input terminal S2 of the dynamic shift register circuit 511 is coupled to the input terminal S4 of the dynamic shift register circuit 513. The input terminal S1 of the dynamic shift register circuit 512 is coupled to receive the inverted clock signal CK'. The input terminal S1 of the dynamic shift register circuit 513 is coupled to receive the clock signal CK.

Each of the level shifters has input terminals L1 and L2, and an output terminal L3. The input terminal L1 and L2 of the level shifter 521 are respectively coupled to the output terminals S5 and S6 of the dynamic shift register circuit 511. The input terminal L1 and L2 of the level shifter 522 are respectively coupled to the output terminals S5 and S6 of the dynamic shift register circuit 512. The input terminals L1 and L2 of the level shifter 523 are respectively coupled to the output terminals S5 and S6 of the dynamic shift register circuit 513.

Input terminals of the inverters 531, 532 and 533 are respectively coupled to the output terminals L3 of the level shifters 521, 522 and 523. Output terminals of the inverters 531 and 532 are respectively coupled to the input terminals S3 of the dynamic shift register circuits 512 and 513. Input terminals of the inverters 541, 542 and 543 are respectively coupled to the output terminals of the inverters 531, 532 and 533. An output terminal of the inverter 541 is coupled to the input terminal S4 of the dynamic shift register circuit 512. The output terminals of the inverters 541, 542 and 543 respectively output sequential pulse trains OUT1, OUT2 and OUT3.

Figure 6:
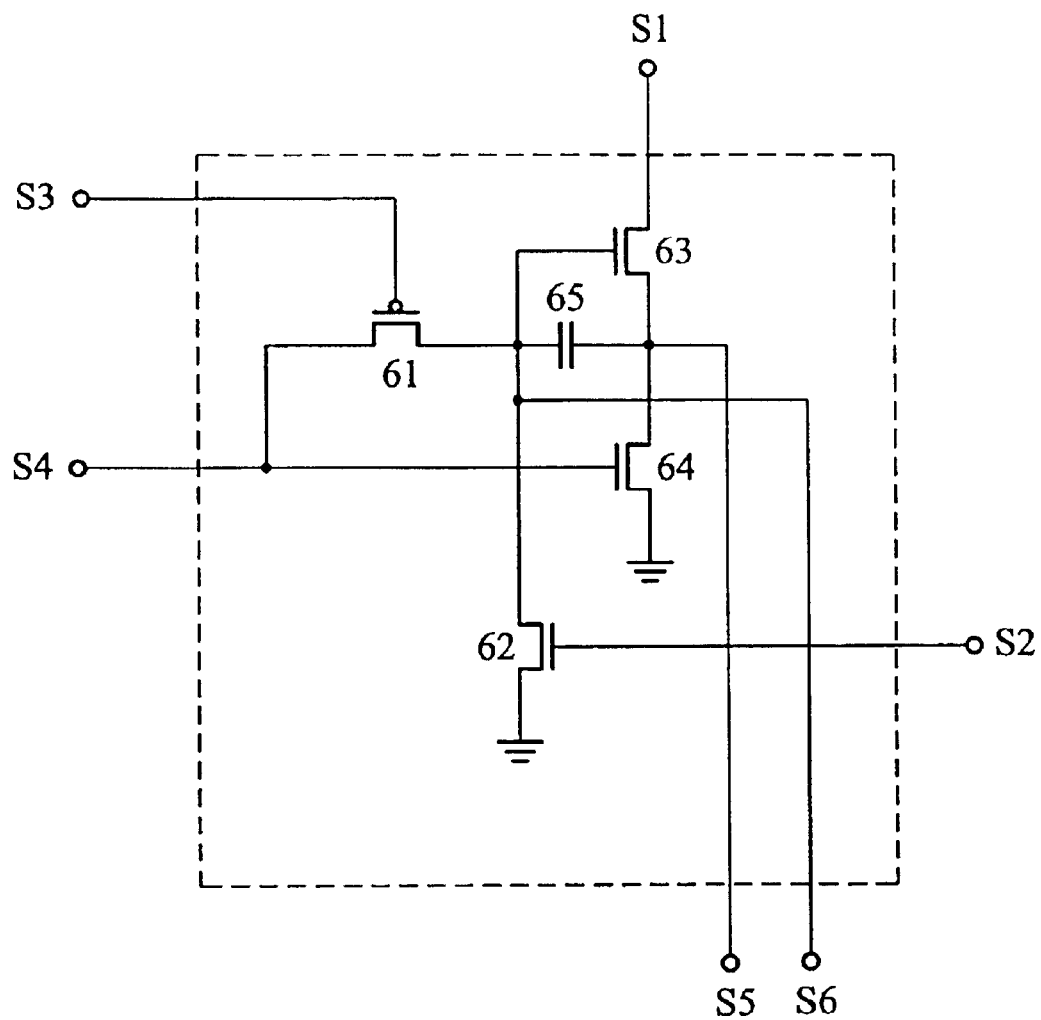
FIG. 6 is a diagram showing a dynamic shift register circuit according to the second embodiment of the invention.

FIG. 6 is a diagram showing the dynamic shift register circuit according to the second embodiment of the invention.

It includes a P-type transistor 61, N-type transistors 62~64, and a capacitor 65. The transistor 61 has a gate coupled to the input terminal S3, a drain coupled to the input terminal S4 and a source coupled to the output terminal S1. The transistor 62 has a gate coupled to the input terminal S2, a source coupled to receive a ground voltage and a drain coupled to the output terminal S6. The transistor 63 has a gate coupled the output terminal S6, a drain coupled to the input terminal S1 and a source coupled to the output terminal S5. The transistor 64 has a gate coupled to the input terminal S4, a drain coupled to the output terminal S5 and a source coupled to receive the ground voltage.

The capacitor 65 is coupled between the gate and source of the transistor 63, which may be the gate-to-source parasitic capacitance of the transistor 63.

Figure 7:
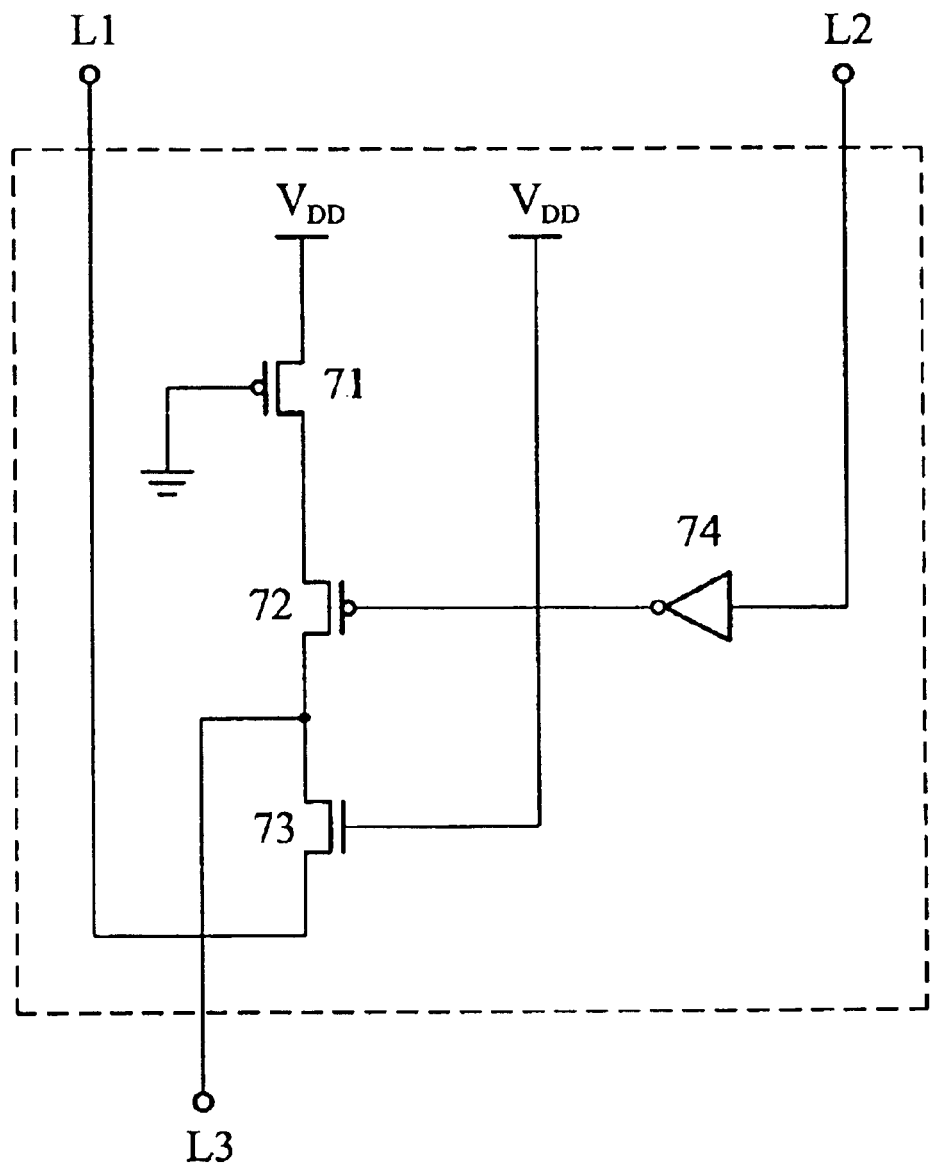
FIG. 7 is a diagram showing a level shifter according to the second embodiment of the invention.

FIG. 7 is a diagram showing the level shifter according to the second embodiment of the invention. It includes P-type transistors 71 and 72, an N-type transistor 73, and an inverter 74. The transistor 71 has a gate coupled to receive the ground voltage and a source coupled to receive a voltage VDD. The transistor 72 has a gate coupled to a drain of the transistor 71 and a drain coupled to the output terminal L3. The transistor 73 has a gate coupled to receive the voltage VDD, a source coupled to the input terminal L1 and a drain coupled to the output terminal L3. The inverter 74 has an input terminal coupled to the input terminal L2 and an output terminal coupled to the gate of the transistor 72.

Figure 8:
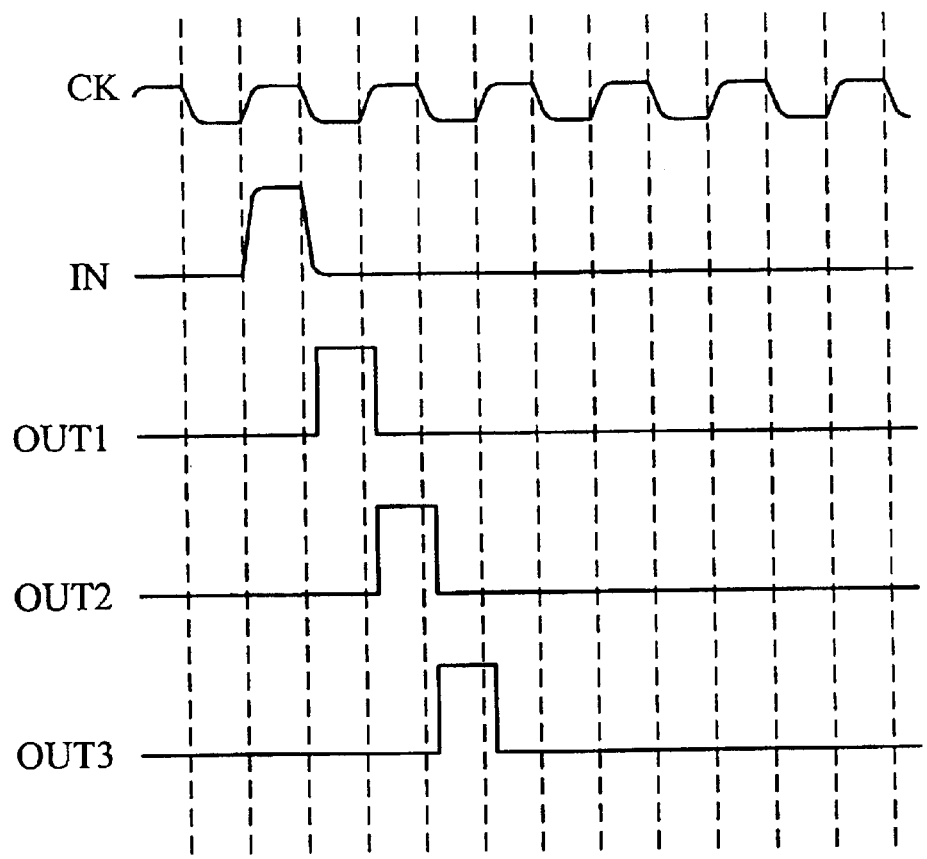
FIG. 8 is a diagram showing timing of the sequential pulse train according to the first and second embodiment.

FIG. 8 is a diagram showing simulated timing of the sequential pulse trains OUT1, OUT2 and OUT3 according to the first and second embodiment. The pulse trains OUT1, OUT2 and OUT3 are sequential with an amplitude of VDD and there is a phase difference of ½ clock period between each adjacent pair of the pulse trains. It should be noted that the amplitude of the clock signal is 3.3V which is lower than the VDD of 9V.

In conclusion, the present invention provides a sequential pulse train generator. Each stage of the sequential pulse train generator includes a dynamic shift register circuit, level shifter, and buffer composed of inverters. The circuit configuration allows the pulse generator to operate with a low-voltage clock signal so that power consumption in transmission of the clock signal is reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A sequential pulse train generator consists of thin-film transistors, comprising:

a first and second dynamic shift register circuit, each of which has a first, second, third, fourth, and fifth input terminal, and a first and second output terminal, first, second, third and fourth input terminal of the first dynamic shift register circuit coupled to receive an initial pulse train, the inverted initial pulse train, a clock signal and the inverted clock signal, the fifth input terminal of the first dynamic shift register circuit coupled to the first input terminal of the second dynamic shift register circuit, the third and fourth input terminal of the second dynamic shift register circuit coupled to receive the inverted clock signal and the clock signal, respectively;

a first and second level shifter, each of which has a first and second input terminal, and an output terminal, the first and second input terminal of the first level shifter coupled to the first and second output terminal of the first dynamic shift register circuit, the output terminal of the first level shifter coupled to the fifth output terminal of the first dynamic shift register circuit, the first and second input terminal of the second level shifter coupled to the first and second output terminal of the second dynamic shift register circuit, the output terminal of the second level shifter coupled to the fifth output terminal of the second dynamic shift register circuit, respectively; and a first and second inverter having output terminals coupled to the output terminals of the first and second level shifter, and outputting a first and second sequential pulse train, the output terminal of the first inverter coupled to the second input terminal of the second dynamic shift register circuit, wherein the amplitude of the clock signal is not larger than half the amplitude of the output signal of the inverter.

2. The sequential pulse train generator as claimed in claim 1, wherein each of the first and second dynamic shift register circuit comprises:

a first transistor of a first type having a gate coupled to the first input terminal and a drain coupled to the second input terminal;

a second transistor of a second type having a gate coupled to the second input terminal and a source coupled to receive a first voltage;

a third transistor of the second type having a gate coupled to the first input terminal, a drain coupled to the fifth input terminal and a source coupled to a drain of the second transistor;

a fourth transistor of the second type having a gate coupled to the source of the third transistor, a drain coupled to a source of the first transistor and a source coupled to receive the first voltage;

a fifth transistor of the second type having a gate coupled to the source of the first transistor, a drain coupled to the third input terminal and a source coupled to the first output terminal;

a sixth transistor of the second type having a gate coupled to the second input terminal, a drain coupled to the source of the fifth transistor and a source coupled to receive the first voltage; and a seventh transistor of the second type having a gate coupled to the gate of the fifth transistor, a drain coupled to the fourth input terminal and a source coupled to the second output terminal.

3. The sequential pulse train generator as claimed in claim 2, wherein each of the first and second level shifters comprise:

an eighth transistor of the first type having a gate coupled to receive the first voltage and a source coupled to receive a second voltage;

a ninth transistor of the first type having a coupled gate and drain, and a source coupled to a drain of the eighth transistor;

a tenth transistor of the first type having a gate coupled to gate of the ninth transistor, a source coupled to receive the second voltage and a drain coupled to the output terminal;

an eleventh transistor of the second type having a gate coupled to the drain of the eighth transistor, a source coupled to the drain of the ninth transistor and a drain coupled to the first input terminal; and a twelfth transistor of the second type having a gate coupled to the gate of the eleventh transistor, a source coupled to the drain of the tenth transistor and a source coupled to the second input terminal.

4. The sequential pulse train generator as claimed in claim 2, wherein each of the first and second dynamic shift register circuit further comprises a capacitor coupled between the gate and source of the fifth transistor.

5. The sequential pulse train generator as claimed in claim 3, wherein the first type is P type and the second type is N type.

6. The sequential pulse train generator as claimed in claim 3, wherein the first voltage is a ground voltage and the second voltage is not less than 7 volt.

7. The sequential pulse train generator as claimed in claim 1, wherein amplitude of the clock signal is lower than 4 volt.

8. A sequential pulse train generator consists of thin-film transistors, comprising:

a first, second and third dynamic shift register circuit, each of which has a first, second, third, and fourth input terminal, and a first and second output terminal, the first, second and third input terminal of the first dynamic shift register circuit coupled to receive an initial pulse train, the inverted initial pulse train and a clock signal, the fourth input terminal of the first dynamic shift register circuit coupled to the second input terminal of the third dynamic shift register circuit, the third input terminal of the second dynamic shift register circuit coupled to receive the inverted clock signal, the third input terminal of the third dynamic shift register circuit coupled to receive the clock signal;

a first, second and third level shifter, each of which has a first and second input terminal, and an output terminal, the first and second input terminal of the first level shifter coupled to the first and second output terminal of the first dynamic shift register circuit, the first and second input terminal of the second level shifter coupled to the first and second output terminal of the second dynamic shift register circuit, the first and second input terminal of the third level shifter coupled to the first and second output terminal of the third dynamic shift register circuit; and a second, third, fourth, fifth, sixth and seventh inverter, input terminals of the second, third and fourth inverter coupled to the output terminals of the first, second and third level shifter, output terminals of the second and third inverter coupled to the first input terminals of the second and third dynamic shift register circuit, input terminals of the fifth, sixth and seventh inverter coupled to the output terminals of the second, third and fourth inverter, an output terminal of the fifth inverter coupled to the second input terminal of the second dynamic shift register circuit, the output terminals of the fifth, sixth and seventh inverter outputting a first, second and third sequential pulse train, respectively, wherein the amplitude of the clock signal is not larger than half the amplitude of the output signal of the inverter.

9. The sequential pulse train generator as claimed in claim 8, wherein each of the first, second and third dynamic shift register circuits comprise:

a first transistor of a first type having a gate coupled to the first input terminal, a drain coupled to the second input terminal and a source coupled to the third output terminal;

a second transistor of a second type having a gate coupled to the fourth input terminal, a source coupled to receive a first voltage and a drain coupled to the third output terminal;

a third transistor of the second type having a gate coupled the second output terminal, a drain coupled to the third input terminal and a source coupled to the first output terminal; and a fourth transistor of the second type having a gate coupled to the second input terminal, a drain coupled to the first output terminal and a source coupled to receive the first voltage.

10. The sequential pulse train generator as claimed in claim 9, wherein each of the first, second and third level shifters comprise:

a fifth transistor of the first type having a gate coupled to receive the first voltage and a source coupled to receive a second voltage;

a sixth transistor of the first type having a gate coupled to a drain of the fifth transistor and a drain coupled to the output terminal;

a seventh transistor of the second type having a gate coupled to receive the second voltage, a source coupled to the first input terminal and a drain coupled to the output terminal; and a first inverter having an input terminal coupled to the second input terminal and an output terminal coupled to the gate of the sixth transistor.

11. The sequential pulse train generator as claimed in claim 9, wherein each of the first, second and third dynamic shift register circuits further comprise a capacitor coupled between the gate and source of the third transistor.

12. The sequential pulse train generator as claimed in claim 10, wherein the first type is P type and the second type is N type.

13. The sequential pulse train generator as claimed in claim 10, wherein the first voltage is a ground voltage and the second voltage is not less than 7 volt.

14. The sequential pulse train generator as claimed in claim 8, wherein amplitude of the clock signal is lower than 4 volt.

15. A sequential pulse train generator consists of thin-film transistors, comprising:

a first, second and third dynamic shift register circuit, each of which has a first, second and third input terminal, and a first and second output terminal, the first and second input terminal of the first dynamic shift register circuit coupled to receive an initial pulse train and a clock signal, the third input terminal of the first dynamic shift register circuit coupled to the first input terminal of the third dynamic shift register circuit, the second input terminal of the second dynamic shift register circuit coupled to receive the inverted clock signal, the second input terminal of the third dynamic shift register circuit coupled to receive the clock signal;

a first, second and third level shifter, each of which has a first and second input terminal, and an output terminal, the first and second input terminal of the first level shifter coupled to the first and second output terminal of the first dynamic shift register circuit, the first and second input terminal of the second level shifter coupled to the first and second output terminal of the second dynamic shift register circuit, the first and second input terminal of the third level shifter coupled to the first and second output terminal of the third dynamic shift register circuit; and a first, second and third buffer, input terminals of the first, second and third buffer coupled to the output terminals of the first, second and third level shifter, output terminals of the second buffer coupled to the third input terminal of the first dynamic shift register circuit and to the first input terminal of the third dynamic shift register circuit;

wherein the amplitude of the clock signal is not larger than half the amplitude of the output signal of the inverter.

* * * * *